(12) United States Patent
Kim et al.

(10) Patent No.: US 7,622,973 B2
(45) Date of Patent: Nov. 24, 2009

(54) PULSE CONTROL DEVICE

(75) Inventors: Kyoung-Nam Kim, Kyoungki-do (KR); Tae-Yun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/477,591

(22) Filed: Jun. 30, 2006

(65) Prior Publication Data

US 2007/0069795 A1  Mar. 29, 2007

(30) Foreign Application Priority Data

Sep. 29, 2005 (KR) .................. 10-2005-0091683
Dec. 29, 2005 (KR) .................. 10-2005-0134232

(51) Int. Cl.
*H03K 5/04* (2006.01)
(52) U.S. Cl. ............... 327/172; 327/176; 327/291; 327/299; 327/378; 327/393; 327/395; 327/400
(58) Field of Classification Search ......... 327/291–294, 327/31, 172–176, 276, 277, 299, 378, 393, 327/395, 400
See application file for complete search history.

(56) References Cited

U.S. PATENT DOCUMENTS

| | | | | |
|---|---|---|---|---|
| 5,418,406 A | * | 5/1995 | Hirano et al. | ............ 327/172 |
| 5,600,274 A | * | 2/1997 | Houston | ............ 327/262 |
| 5,808,961 A | * | 9/1998 | Sawada | ............ 365/233 |
| 6,275,446 B1 | | 8/2001 | Abedifard | |
| 6,456,562 B1 | | 9/2002 | Abedifard | |
| 6,552,587 B2 | * | 4/2003 | Kim et al. | ............ 327/158 |
| 6,784,709 B2 | | 8/2004 | Ryu | |
| 6,812,764 B2 | * | 11/2004 | Jung | ............ 327/262 |
| 6,819,151 B2 | * | 11/2004 | Mikhalev et al. | ............ 327/141 |
| 2004/0257132 A1 | | 12/2004 | Park | |
| 2005/0122147 A1 | * | 6/2005 | Park | ............ 327/172 |
| 2005/0134393 A1 | * | 6/2005 | Kim et al. | ............ 331/36 C |
| 2005/0135430 A1 | * | 6/2005 | Le et al. | ............ 370/517 |
| 2005/0184780 A1 | | 8/2005 | Chun | |

FOREIGN PATENT DOCUMENTS

| | | |
|---|---|---|
| JP | 2002-42466 | 2/2002 |
| JP | 2005-93071 | 4/2005 |
| JP | 2005-158127 | 6/2005 |
| KR | 1999-003236 | 1/1999 |

* cited by examiner

*Primary Examiner*—Lincoln Donovan
*Assistant Examiner*—Patrick O'Neill
(74) *Attorney, Agent, or Firm*—IP & T Law Firm PLC

(57) ABSTRACT

Provided is a pulse control device is maintained with a constant pulse width corresponding to a change of process or temperature. The pulse control device comprises a fuse set for selectively outputting a delay increase signal and a delay decrease signal that have a different state based on a cutting or non-cutting state of a fuse on which information on a change of process is programmed, and a pulse generator provided with a plurality of delay cells with predetermined time delay for selectively increasing or decreasing the number of the plurality of delay cells depending on the delay increase signal and the delay decrease signal to generate an internal clock with a pulse width corresponding to the number of the increased or decreased delay cells.

22 Claims, 8 Drawing Sheets

PULSE CONTROL DEVICE

FIELD OF THE INVENTION

The present invention relates to a pulse control device; and more particularly, to a technology capable of generating a pulse with a constant pulse delay and pulse width corresponding to a change of process or temperature in a device that creates an internal pulse by using an external clock input.

DESCRIPTION OF RELATED ARTS

Generally, a synchronous DRAM controls all input/output signals to be synchronized to a rising edge and a falling edge of a system clock when the clock is input thereto. Therefore, most logic elements within the DRAM are made to be synchronous to the clock and internal timing is also controlled to be synchronous to the clock.

In addition, such a DRAM doesn't use an input clock as received but, instead, creates a high level pulse or low level pulse with a needed delay and constant width on the basis of an external clock by buffering the input clock at a CMOS level.

The pulse delay is determined based on an internal timing and the pulse width is determined by a combined logic of a path with delay cells and a general path.

FIGS. 1a and 1b are a circuit diagram of a conventional pulse control device that generates a high level pulse and its operational timing diagram, respectively.

The conventional pulse control device is provided with a buffer B1, inverters IV1 to IV4, and a NAND gate ND1. The buffer B1 buffers and outputs an input clock CLK. The NAND gate ND1 NAND-operates the output of the buffer B1 and an output of the inverters IV1 to IV3 with a delay time of td2. The inverter IV4 inverts the output of the NAND gate ND1 to provide an internal high pulse HP to a load L.

This conventional pulse control device as configured above receives the external clock CLK and generates the high pulse HP with a pulse delay of td1 and a pulse width of td2 on the basis of a rising edge of the clock CLK.

FIGS. 2a and 2b are a circuit diagram of a conventional pulse control device that generates a low level pulse and its operational timing diagram, respectively.

The conventional pulse control device is provided with a buffer B2, inverters IV5 to IV8, and an NOR gate NOR1. The buffer B2 buffers and outputs an input clock CLK. The NOR gate NOR1 NOR-operates the output of the buffer B2 and an output of the inverters IV5 to IV7 with a time delay of td4. The inverter IV8 inverts the output of the NOR gate NOR1 to provide an internal low pulse LP to a load L.

This conventional pulse control device as configured above takes the external clock CLK and generates the low pulse LP with a pulse delay of td3 and a pulse width of td4 on the basis of a falling edge of the clock CLK.

This generation of the internal pulse using the external clock by the DRAM as described above has an advantage as follows. As shown in FIG. 3a, a valid window (pulse width of clock+set-up time+hold time) of address or command becomes large if the clock CLK is used to output address, command signal or data D to a next stage. However, as depicted in FIG. 3b, the valid window becomes small, if a pulse P is utilized, compared to using the clock CLK. Accordingly, this improves an internal minimum clock period (tCK) performance and thus enables a high frequency operation.

The delay amounts such as td1, td2, td3 and td4 in FIGS. 1a and 2a set forth above are different from each other, dependent upon a change of process or temperature. FIG. 4a shows a delay amount in progress of process under a typical condition or at a room or standard temperature, FIG. 4b shows a delay amount in progress of process under a slow condition or at a high temperature, and FIG. 4c shows a delay amount in progress of process under a fast condition or at a low temperature.

The delay amount in progress of process under the slow condition or at the high temperature as depicted in FIG. 4b has a relatively large value compared to that in progress of process under the fast condition or at the low temperature as in FIG. 4c.

It is assumed that a variable value of delay amount td1 by a change of process is less than that of delay amount td2 by a change of process, and a variable value of delay amount td1 by a change of temperature is less than that of delay amount td2 by a change of temperature.

The progress of process under the slow condition has a greater td2 delay amount than that under the typical condition, thus creating a pulse with large pulse width. The progress of process under the fast condition has a smaller td2 delay amount than that under the typical condition, thereby producing a pulse with small pulse width. In this case, however, the pulse width of the output pulse is varied depending on a change of process, which performs a different operation.

In addition, the td2 delay amount at high temperature is greater than that of the standard temperature; and therefore, a pulse with large pulse width results. On the other hand, the td2 delay amount at low temperature is less than that of the standard temperature; and thus, a pulse width becomes small.

As the pulse width of the output pulse is varied depending on a change of process or temperature, varying operation will occur.

FIGS. 5a-5c are diagrams for explaining how an internal pulse width is varied depending on a change of process or temperature.

As shown in FIG. 5a, a transmission gate T1 provides input data DIN as output data DOUT during an interval where an internal clock iclkp is at a high level. At this time, it is assumed that data value is changed during a constant data valid window. Then, the output data DOUT in progress of process under the fast condition or at the low temperature as shown in FIG. 5b is different from that in progress of process under the slow condition or at the high temperature as depicted in FIG. 5c.

Namely, FIG. 5b shows that the output data DOUT is provided as one data bit while the internal clock iclkp is at a high level, while FIG. 5c shows that the output data DOUT is erroneously outputted as two data bits while the internal clock iclkp is at a high level.

SUMMARY OF THE INVENTION

It is, therefore, a primary object of the present invention to provide a pulse control device capable of generating a pulse with a constant pulse width corresponding to a change of process by controlling a fuse involved therein.

Another object of the invention is to offer a pulse control device capable of generating a pulse with a constant pulse width corresponding to a change of temperature by a mode register set.

In accordance with one aspect of the present invention, there is provided a pulse control device including: a fuse set for selectively outputting a delay increase signal and a delay decrease signal that have a different state based on a cutting or non-cutting state of a fuse on which information on a change of process is programmed; and a pulse generator provided with a plurality of delay cells with predetermined time delay for selectively increasing or decreasing the number of the plurality of delay cells depending on the delay increase signal and the delay decrease signal to generate an internal clock with a pulse width corresponding to the number of the increased or decreased delay cells.

In accordance with another aspect of the present invention, there is provided a pulse control device including: a mode register set for selectively outputting a delay increase signal and a delay decrease signal that have a different state corresponding to a change of temperature; and a pulse generator provided with a plurality of delay cells with predetermined time delay for selectively increasing or decreasing the number of the plurality of delay cells depending on the delay increase signal and the delay decrease signal to generate an internal clock with a pulse width corresponding to the number of the increased or decreased delay cells.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be set forth in detail with reference to the accompanying drawings.

Figure 1A:
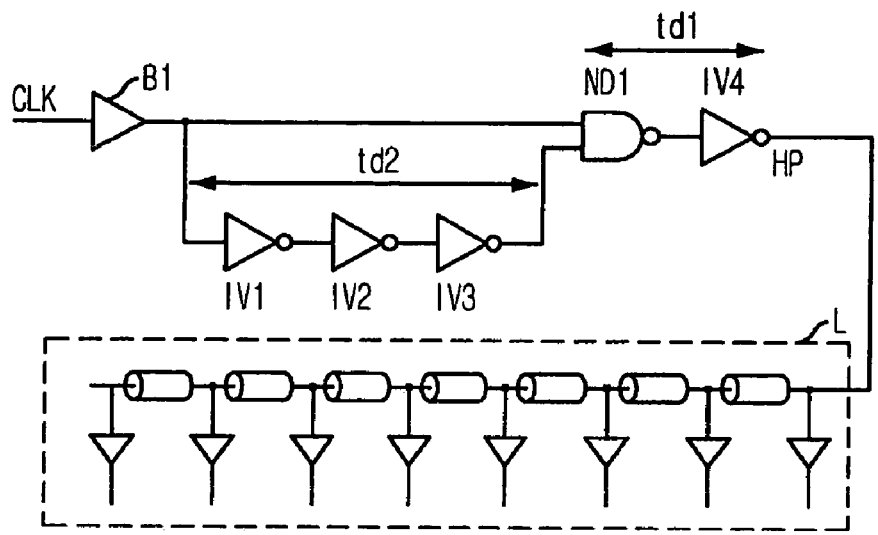
FIGS. 1a and 1b are a circuit diagram of a conventional pulse control device that generates a high level pulse and its operational timing diagram, respectively.
Figure 1B:
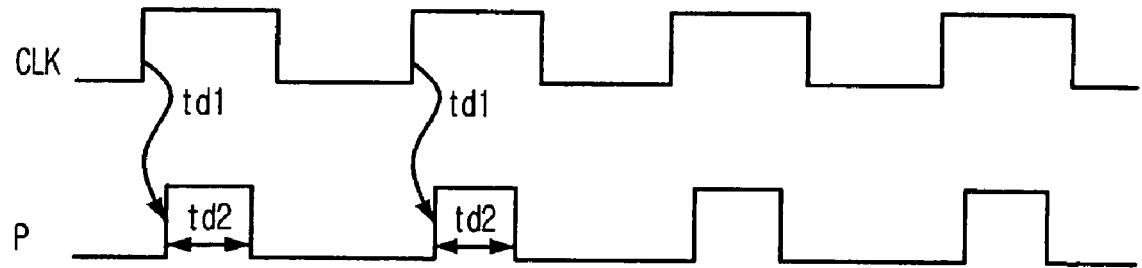
Figure 2A:
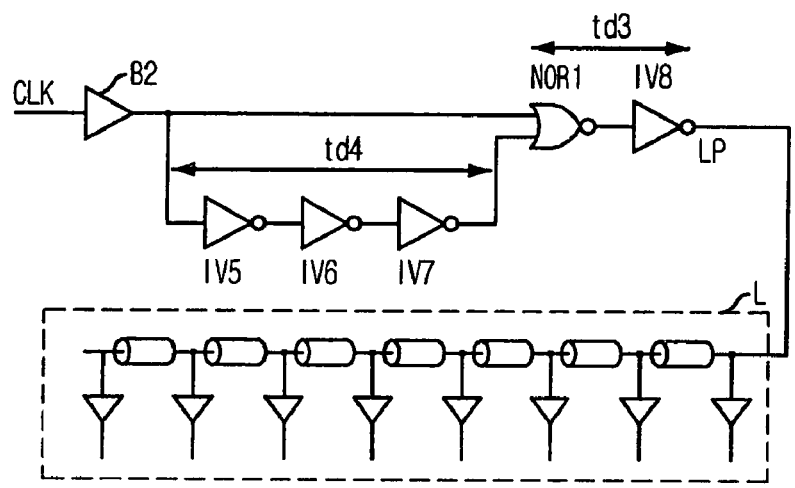
FIGS. 2a and 2b are a circuit diagram of a conventional pulse control device that generates a low level pulse and its operational timing diagram, respectively.
Figure 2B:
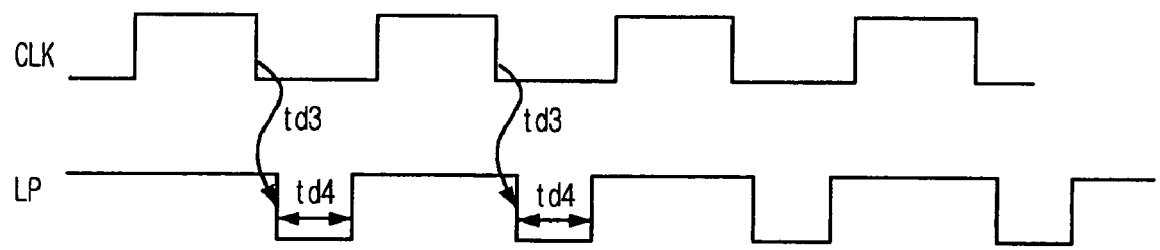
Figure 3A:
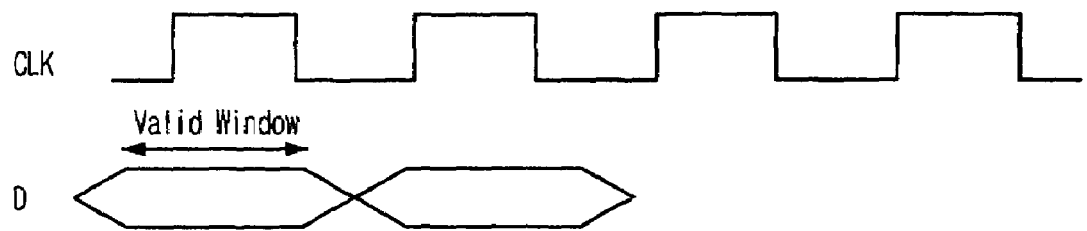
FIGS. 3a and 3b are diagrams for explaining an operation of a conventional pulse control device.
Figure 3B:
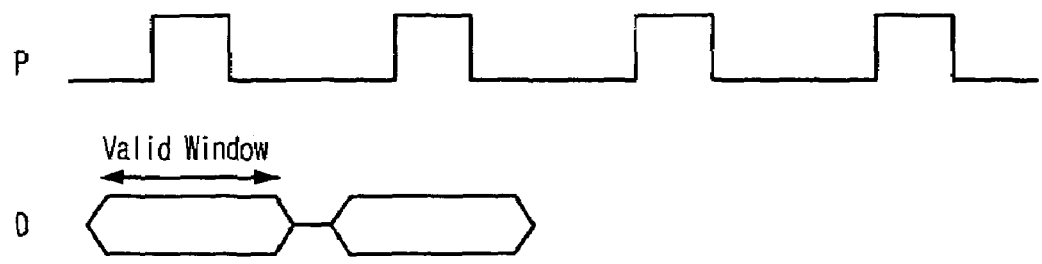
Figure 4A:
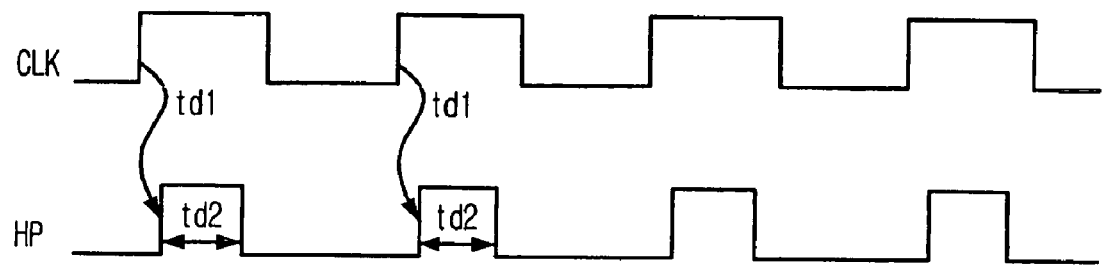
FIGS. 4a to 4c are diagrams showing a variation of pulse depending on a change of process or temperature in a conventional pulse control device.
Figure 4B:
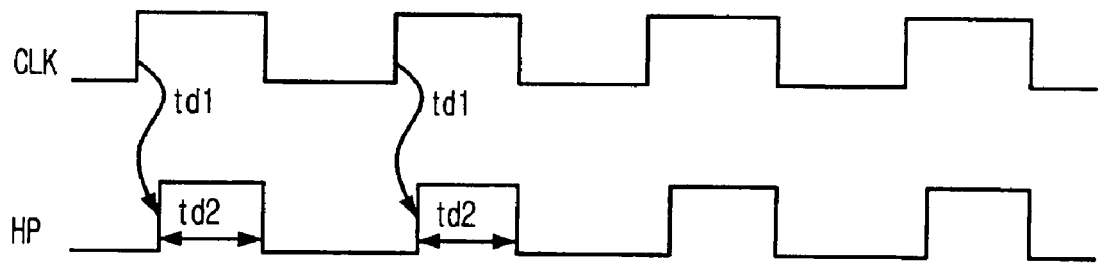
Figure 4C:
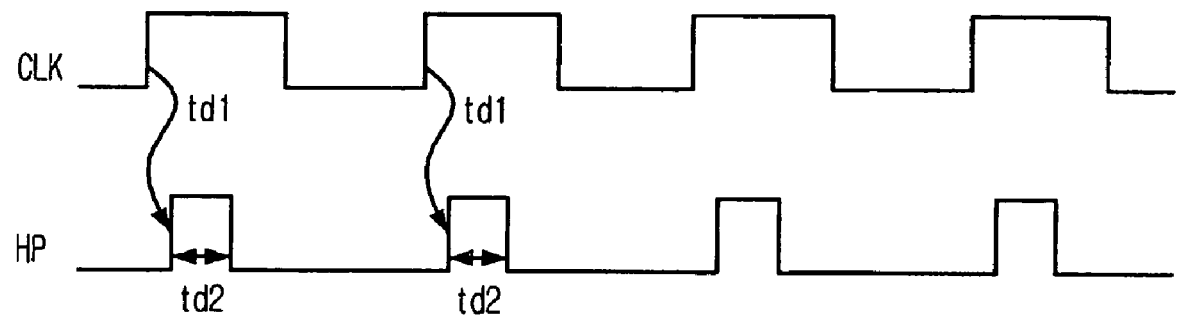
Figure 5A:
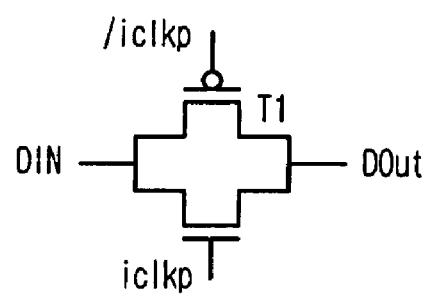
FIGS. 5a to 5c are diagrams for describing some problems of a conventional pulse control device.
Figure 5B:
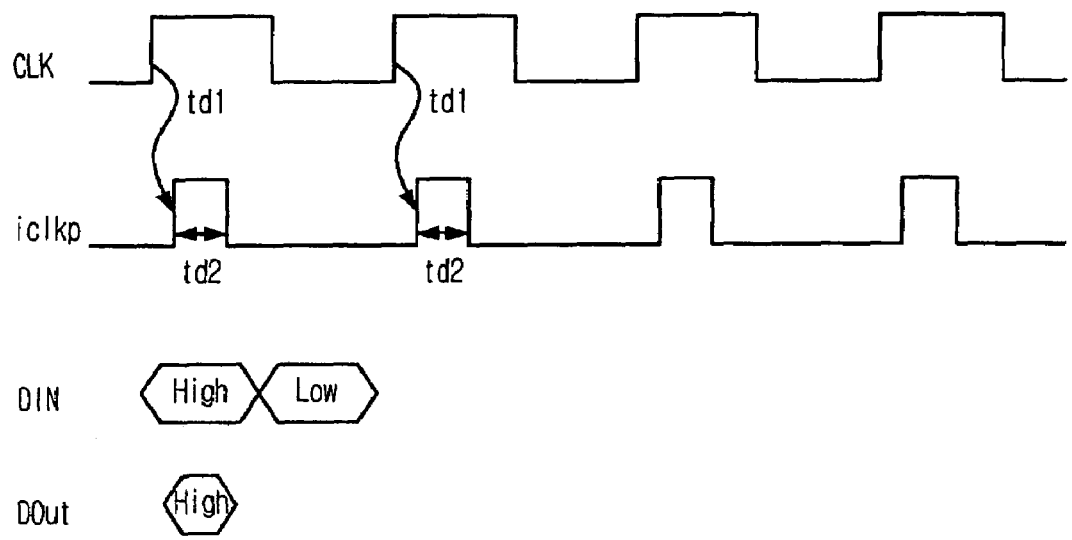
Figure 5C:
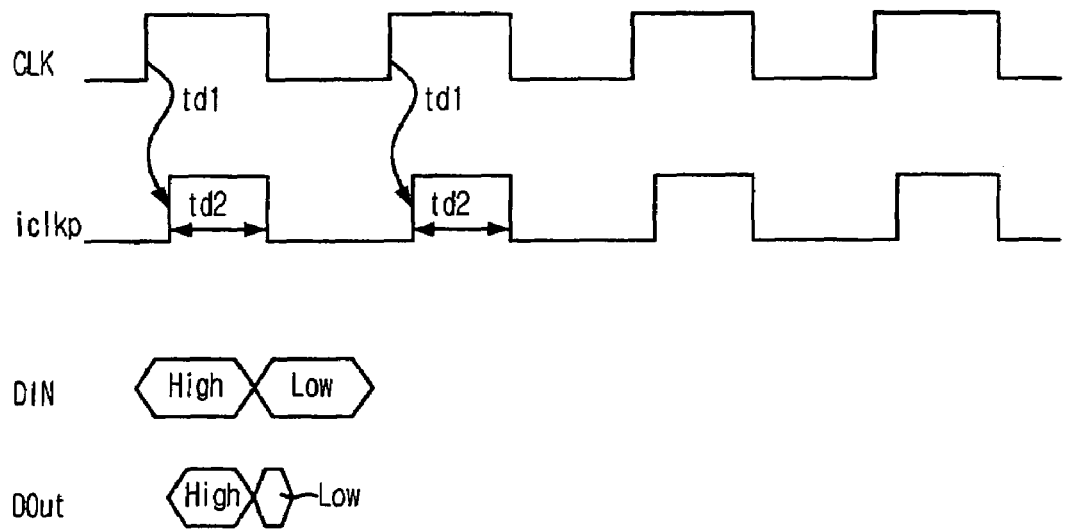
Figure 6:
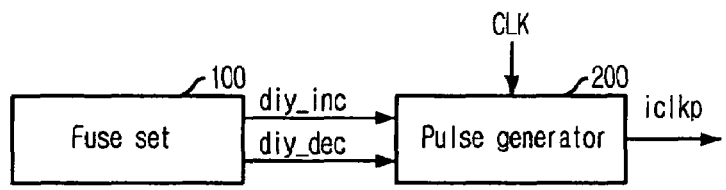
FIG. 6 is a block diagram of a configuration of a pulse control device in accordance with the present invention.

FIG. 6 is a block diagram illustrating a configuration of a pulse control device in accordance with the present invention.

The pulse control device of the present invention is provided with a fuse set 100 and a pulse generator 200.

The fuse set 100 selectively outputs a delay increase signal $dly_{13}inc$ and a delay decrease signal $dly_{13}dec$ that have a different state depending on a cutting or non-cutting state of a fuse involved therein to the pulse generator 200. The pulse generator 200 receives a clock CLK and increases or decreases the number of delay cells prepared therein based on the delay increase signal $dly_{13}inc$ and the delay decrease signal $dly_{13}dec$ to constantly control a pulse width of an internal clock iclkp.

Figure 7:
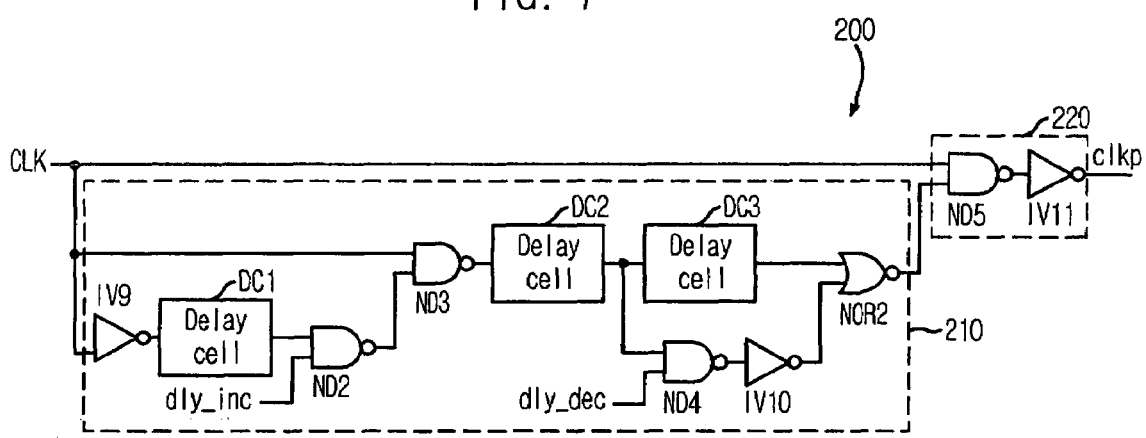
FIG. 7 is a detailed circuit diagram of the pulse generator shown in FIG. 6.

FIG. 7 is a detailed circuit diagram of the pulse generator 200 shown in FIG. 6.

As illustrated therein, the pulse generator 200 includes a delay controller 210 and a logical operator 220.

The delay controller 210 is composed of inverters IV9 and IV10, delay cells DC1 to DC3, NAND gates ND2 to ND4, and a NOR gate NOR2.

The inverter IV9 inverts and outputs the clock CLK. The delay cell DC1 delays the output of the inverter IV9 for a preset time and then provides a delayed clock. The NAND gate ND2 NAND-operates the output of the delay cell DC1 and the delay increase signal $dly_{13}inc$. The NAND gate ND3 NAND-operates the output of the NAND gate ND2 and the clock CLK. The delay cell DC2 delays the output of the NAND gate ND3 for a preset time. The NAND gate ND4 NAND-operates the output of the delay cell DC2 and the delay decrease signal $dly_{13}dec$.

The inverter IV10 inverts the output of the NAND gate ND4. The delay cell DC3 delays the output of the delay cell DC2 for a preset time. The NOR gate NOR2 NOR-operates the output of the delay cell DC3 and the output of the inverter IV10.

The logical operator 220 includes a NAND gate ND5 and an inverter IV11. The NAND gate ND5 NAND-operates the clock CLK and the output of the NOR gate NOR2. The inverter IV11 inverts the output of the NAND gate ND5 to produce the internal clock iclkp.

Figure 8:
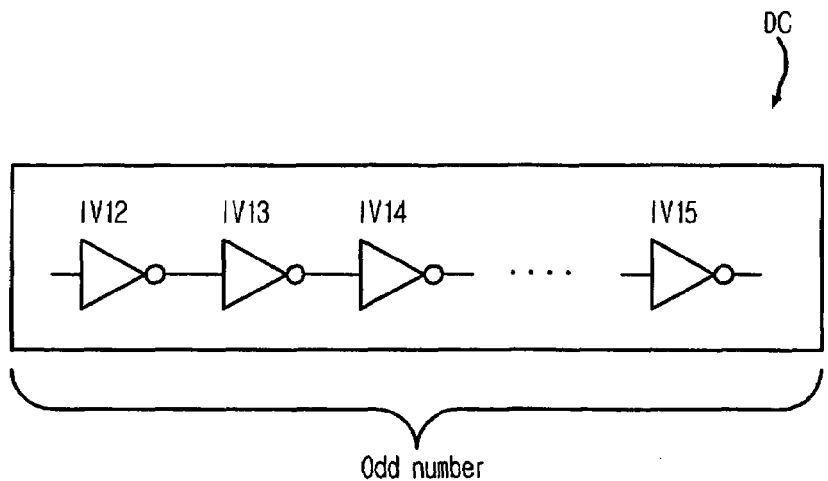
FIG. 8 is a detailed circuit of the delay cell shown in FIG. 7.

FIG. 8 illustrates a detailed circuit of the delay cell DC shown in FIG. 7. The delay cell DC has an inverter chain structure that is provided with a plurality of inverters IV12 to IV15 connected in series to delay an input signal for a preset time. The plurality of inverters IV12 to IV15 is preferably set to be an odd number.

Operation of the invention as configured above will be described in detail hereinafter.

Conventionally, a change of process contains innumerable factors such as a change of operational characteristic of each MOSFET transistor, a change of electrical characteristic of each layer for each process or Critical Dimension (CD), etc.

To reduce the width of this process change, process equipment should be upgraded to high-priced units or careful control should be made for each wafer while investing lots of people and time every process. However, this method causes an increase in the cost of products and a decrease in productivity. Accordingly, it is important to design a product that is flexible to the change of process.

A series of processes prior to shipping DRAM as a single product is as follows.

First of all, a fab-out is conducted for a wafer where a progress of each process is completed. And then, measurement is made as to whether process progresses of each lot or each wafer are fast or slow on the basis of the typical condition through a given test pattern.

Thereafter, Probe Test 1 (PT1) is carried out for condition confirmation of each unit chip of each wafer. Next, a step of laser-cutting a fuse related to a redundancy cell through a program is conducted to execute a repair that replaces a fail cell of a unit chip on each wafer with the redundancy cell.

Therefore, the invention applies to the fuse set 100 process change information detected in the step of testing the process progress condition of each wafer through the test pattern set forth above, and then programs it in the laser-cutting step.

Accordingly, each pulse width and delay amount of DRAM can be kept almost constant regardless of the change of process.

That is, the fuse set 100 controls the cutting state of the fuse based on the programmed information in the laser-cutting step as described above to selectively output the delay increase signal $dly_{13}inc$ or delay decrease signal $dly_{13}dec$ to the pulse generator 200. Then, the number of delay cells DC selected in the delay controller 210 of the pulse generator 200 is changed accordingly.

Figure 9A:
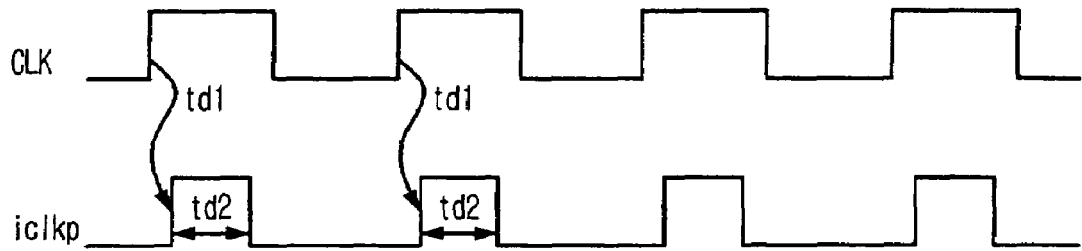
FIGS. 9a to 9c are pulse waveforms of the pulse control device in accordance with the invention.
Figure 9B:
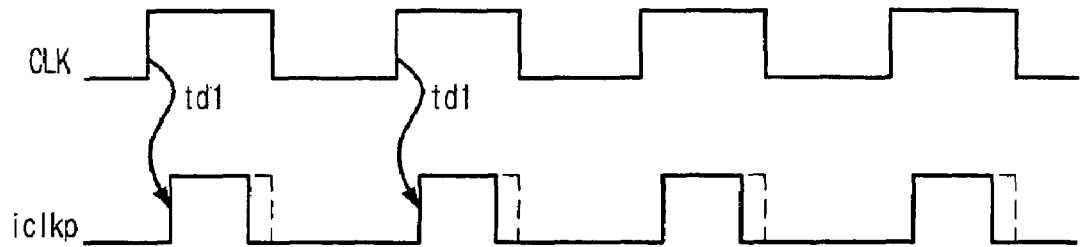
Figure 9C:
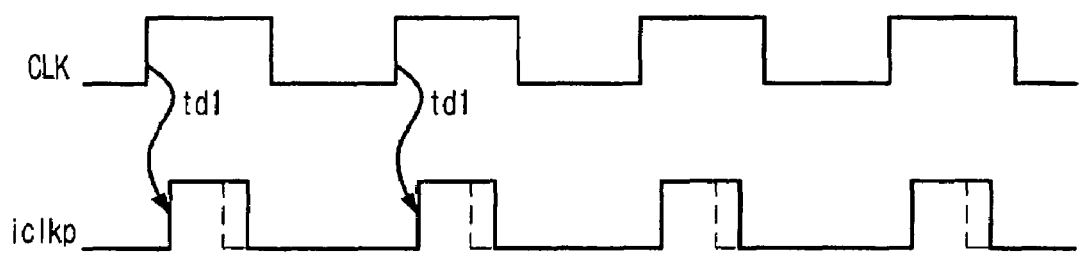

FIGS. 9a to 9c are pulse waveforms of the pulse control device in accordance with the invention.

For example, if the process is progressed under the typical condition as shown in FIG. 9a, the fuse program is not performed. Accordingly, the delay increase signal $dl_{13}inc$ and the delay decrease signal $dly_{13}dec$ are all kept to low levels. In this case, the NAND gate ND3 and the NOR gate NOR2 are operated as an inverter. Thus, the input clock CLK is created as the internal clock iclkp with a pulse width by an added time delay of the delay cells DC2 to DC3. The pulse width by td2 in FIG. 9a includes the added time delay of the delay cells DC2 to DC3.

As shown in FIG. 9b, if it is measured in the step of measuring the progress condition of process that the process is progressed in the slow condition, a pulse indicated by a dotted line would be generated if there is the same time delay (delay cell DC2+delay cell DC3) as the process progressed under the typical condition. Thus, in this case, the delay decrease signal $dly_{13}dec$ is controlled to be at a high level and the delay increase signal $dly_{13}inc$ is controlled to be at a low level through the program of the fuse set 100.

Thus, if the process is progressed in the slow condition, a pulse with a pulse width by a time delay of the delay cell DC2 is produced. This pulse width becomes the same as that in the progress of process of the typical condition shown in FIG. 9a.

On the other hand, as shown in FIG. 9c, if it is measured in the step of measuring the progress condition of process that the process is progressed under the fast condition, a pulse such as a dotted line would be created if there is the same time delay (delay cell DC2+delay cell DC3) as the process progressed under the typical condition. Thus, in this case, the delay decrease signal $dly_{13}dec$ is controlled to be at a low level and the delay increase signal $dly_{13}inc$ is controlled to be at a high level through the program of the fuse set 100.

Thus, if the process is progressed under the fast condition, a pulse with a pulse width by an added time delay of the delay cells, DC1+DC2+DC3, is produced. This pulse width becomes the same as that in the progress of process of the typical condition shown in FIG. 9a.

Subsequently, the logical operator 220 logically operates the clock CLK and the output of the delay controller 210 to provide the internal clock iclkp. Even though the present invention is described with respect to outputting one internal clock iclkp as the embodiment, the invention is not limited thereto but may output a plurality of pulse signals.

That is, the pulse generator 200 receives the clock CLK and increases or decreases the number of the delay cells prepared therein based on the delay increase signal $dly_{13}inc$ and the delay decrease signal $dly_{13}dec$ to constantly control the pulse width of the internal clock iclkp.

Therefore, the present invention is provided with a variable number of delay cells DC for each process progressed under the slow condition and the fast condition on the basis of the typical condition. Further, the invention controls the pulse generator 200 so that it can generate a pulse with a constant pulse width corresponding to the change of process by selecting the variable number of delay cells DC depending on the setting or non-setting of the fuse set 100.

Figure 10:
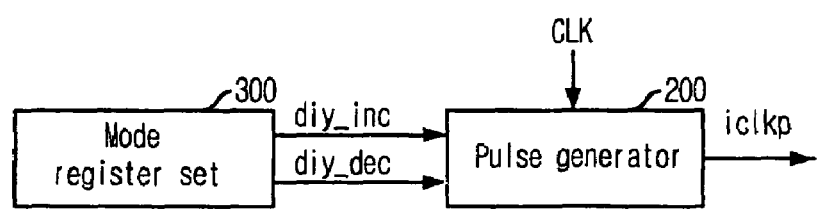
FIG. 10 is a block diagram of a pulse control device in accordance with another embodiment of the invention.

FIG. 10 is a block diagram of a pulse control device in accordance with another embodiment of the invention.

The embodiment of FIG. 10 comprises a mode register set 300 and a pulse generator 200.

The mode register set 300 selectively provides the pulse generator 200 with a delay increase signal $dly_{13}inc$ and a delay decrease signal $dly_{13}dec$ that have a different state depending on an address input when a register is set. The pulse generator 200 receives the clock CLK and increases or decreases the number of delay cells prepared therein based on the delay increase signal $dly_{13}inc$ and the delay decrease signal $dly_{13}dec$ to constantly control the pulse width of an internal clock iclkp.

Since a detailed configuration of the pulse generator 200 is the same as that of FIG. 7, its description will be omitted here.

An operational procedure of the invention as configured above will be described with reference to the waveform diagrams of FIGS. 9a to 9c.

At a standard temperature, the delay increase signal $dly_{13}inc$ and the delay decrese signal $dly_{13}dec$ are all maintained as low levels by the mode register set 300, as shown in FIG. 9a. In this case, the NAND gate ND3 and the NOR gate NOR2 are operated as an inverter. Thus, the input clock CLK is created as the internal clock iclkp with a pulse width by an added time delay of the delay cells DC2 to DC3. The pulse width by td2 in FIG. 9a indicates the added time delay of the delay cells DC2 to DC3.

Meanwhile, at a high temperature, if there is the same time delay (delay cell DC2+delay cell DC3) as the time delay at the general standard temperature, a pulse indicated by a dotted line would be generated, as depicted in FIG. 9b. Thus, in this case, the delay decrease signal $dly_{13}dec$ is controlled to be at a high level and the delay increase signal $dly_{13}inc$ is controlled to be at a low level, by the mode register set 300.

According to the above operation, at the high temperature, a pulse with a pulse width by a time delay of the delay cell DC2 is produced. This pulse width becomes the same as that at the standard temperature.

On the other hand, at a low temperature, if there is the same time delay (the delay cell DC2 plus the delay cell DC3) as the time delay at the general standard temperature, a pulse such as a dotted line would be generated as shown in FIG. 9c. Thus, in this case, the delay decrease signal $dly_{13}dec$ is controlled to be at a low level and the delay increase signal $dly_{13}inc$ is controlled to be at a high level, by the mode register set 300.

According to the foregoing, at the low temperature, a pulse with a pulse width by an added time delay of the delay cells, DC1+DC2+DC3, is produced. This pulse width becomes the same as that at the standard temperature. Thereafter, the logical operator 220 logically operates the clock CLK and the output of the delay controller 210 to provide the internal clock iclkp.

Therefore, the present invention is provided with a variable number of delay cells DC for each of the high and low temperatures on the basis of the standard temperature. Further, the invention controls the pulse generator 200 so that it can generate a pulse with a constant pulse width corresponding to the change of temperature by selecting the required delay cells DC under the control of the mode register set 300.

As described above, the present invention provides an advantage in that it can reduce a pulse width skew that may create due to a change of process by generating a pulse with a constant pulse width corresponding to a change of process or temperature.

The present application contains subject matter related to Korean patent application No. 2005-91683 and No. 2005-134232, filed with the Korean Intellectual Property Office on Sep. 29, 2005 and on Dec. 29, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A pulse control device comprising:
   a single fuse set for selectively outputting a delay increase signal and a delay decrease signal that have a different state based on a cutting or non-cutting state of a fuse determined according to information on a change of process; and
   a pulse generator having a delay controller provided with a plurality of delay cells having a predetermined time delay for selectively increasing or decreasing the number of activated delay cells in response to the delay increase signal and the delay decrease signal to generate an internal clock of which a pulse width is controlled corresponding to the number of the activated delay cells,
   wherein the information on the change of process is detected in a test pattern step of testing whether or not a process of each wafer is progressed,
   wherein the delay controller includes:
   a first delay cell for delaying an inverted clock of the clock;
   a first NAND gate for NAND-operating the output of the first delay cell and the delay increase signal;
   a second NAND gate for NAND-operating the clock and the output of the first NAND gate;
   a second delay cell for delaying the output of the second NAND gate;
   a third delay cell for delaying the output of the second delay cell;
   a third NAND gate for NAND-operating the output of the second delay cell and the delay decrease signal; and
   a NOR gate for NOR-operating an inverted output of the third NAND gate and the output of the third delay cell.

2. The pulse control device as recited in claim 1, wherein the fuse set outputs both the delay increase signal and the delay decrease signal as a lower level than a predetermined level if the process is progressed under a predetermined condition.

3. The pulse control device as recited in claim 1, wherein the fuse set outputs the delay increase signal as a lower level than a predetermined level and the delay decrease signal as a higher level than a predetermined level if the process is progressed at a slower speed than a predetermined condition.

4. The pulse control device as recited in claim 1, wherein the fuse set outputs the delay increase signal as a higher level than a predetermined level and the delay decrease signal as a lower level than a predetermined level if the process is progressed at a faster speed than a predetermined condition.

5. The pulse control device as recited in claim 1, wherein the pulse generator further includes:
   a logical operator for logically operating the clock and an output of the delay controller to create the internal clock.

6. The pulse control device as recited in claim 5, wherein the delay controller increases the pulse width of the clock by a time delay of first and second delay cells among the plurality of delay cells if the delay decrease signal and the delay increase signal are all inactivated, and then outputs a delayed clock.

7. The pulse control device as recited in claim 5, wherein the delay controller increases the pulse width of the clock by the time delay of the first delay cell among the plurality of delay cells if the delay decrease signal is activated, and then outputs a delayed clock.

8. The pulse control device as recited in claim 5, wherein the delay controller increases the pulse width of the clock by a time delay of first, second and third delay cells among the plurality of delay cells if the delay increase signal is activated, and then outputs a delayed clock.

9. The pulse control device as recited in claim 5, wherein the logical operator includes:
   a fourth NAND gate for NAND-operating the clock and the output of the delay controller; and
   an inverter for inverting the output of the fourth NAND gate to provide the internal clock.

10. The pulse control device as recited in claim 1, wherein each of the plurality of delay cells includes a plurality of inverters connected in series, which delay and output an input signal for a predetermined time.

11. The pulse control device as recited in claim 10, wherein the number of the plurality of inverters is an odd number.

12. A pulse control device comprising:
    a mode register set for selectively outputting a delay increase signal and a delay decrease signal that have a different state corresponding to a change of temperature; and
    a pulse generator having a delay controller provided with a plurality of delay cells having a predetermined time delay for selectively increasing or decreasing the number of activated delay cells in response to the delay increase signal and the delay decrease signal to control the pulse width of an internal clock,
    wherein the delay controller includes:
    a first delay cell for delaying an inverted clock of the clock;
    a first NAND gate for NAND-operating the output of the first delay cell and the delay increase signal;
    a second NAND gate for NAND-operating the clock and the output of the first NAND gate;
    a second delay cell for delaying the output of the second NAND gate;
    a third delay cell for delaying the output of the second delay cell;
    a third NAND gate for NAND-operating the output of the second delay cell and the delay decrease signal; and
    a NOR gate for NOR-operating an inverted output of the third NAND gate and the output of the third delay cell.

13. The pulse control device as recited in claim 12, wherein the mode register set outputs both of the delay increase signal and the delay decrease signal as a low level if the temperature is a predetermined standard temperature.

14. The pulse control device as recited in claim 12, wherein the mode register set outputs the delay increase signal as a low level and the delay decrease signal as a high level if the temperature is higher than a predetermined standard temperature.

15. The pulse control device as recited in claim 12, wherein the mode register set outputs the delay increase signal as a high level and the delay decrease signal as a low level if the temperature is lower than a predetermined standard temperature.

16. The pulse control device as recited in claim 12, wherein the pulse generator further includes:
    a logical operator for logically operating the clock and an output of the delay controller to create the internal clock.

17. The pulse control device as recited in claim 16, wherein the delay controller increases the pulse width of the clock by a time delay of first and second delay cells among the plurality of delay cells if the delay decrease signal and the delay increase signal are all inactivated, and then outputs a delayed clock.

18. The pulse control device as recited in claim 16, wherein the delay controller increases the pulse width of the clock by a time delay of the first delay cell among the plurality of delay cells if the delay decrease signal is activated, and then outputs a delayed clock.

19. The pulse control device as recited in claim 16, wherein the delay controller increases the pulse width of the clock by a time delay of first, second and third delay cells among the plurality of delay cells if the delay increase signal is activated, and then outputs a delayed clock.

20. The pulse control device as recited in claim 16, wherein the logic operator includes:
   a fourth NAND gate for NAND-operating the clock and the output of the delay controller; and
   an inverter for inverting the output of the fourth NAND gate to provide the internal clock.

21. The pulse control device as recited in claim 12, wherein each of the plurality of delay cells includes a plurality of inverters connected in series, which delay and output an input signal for a predetermined time.

22. The pulse control device as recited in claim 21, wherein the number of the plurality of inverters is an odd number.

\* \* \* \* \*